(12) United States Patent
Han et al.

(10) Patent No.: US 7,405,105 B2
(45) Date of Patent: Jul. 29, 2008

(54) STACK PACKAGE USING ANISOTROPIC CONDUCTIVE FILM (ACF) AND METHOD OF MAKING SAME

(75) Inventors: Jun-Soo Han, Cheonan-si (KR);
Gil-Beag Kim, Cheonan-si (KR);
Sang-Young Kim, Cheonan-si (KR);
Yong-Jin Jung, Cheonan-si (KR);
Hyun-Ik Hwang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/905,243

(22) Filed: Sep. 28, 2007

(65) Prior Publication Data

US 2008/0026507 A1    Jan. 31, 2008

Related U.S. Application Data

(62) Division of application No. 11/133,317, filed on May 20, 2005, now Pat. No. 7,291,925.

(30) Foreign Application Priority Data

Nov. 16, 2004    (KR) ............... 10-2004-0093479

(51) Int. Cl.
*H01L 21/00* (2006.01)
(52) U.S. Cl. .................... 438/108; 438/613
(58) Field of Classification Search ............ 438/127, 438/613, 108; 257/737, 777, 686
See application file for complete search history.

(56) References Cited

U.S. PATENT DOCUMENTS

| 6,235,554 B1 | 5/2001 | Akram et al. |
| 6,472,735 B2 | 10/2002 | Isaak |
| 6,787,917 B2 | 9/2004 | Lee et al. |
| 2002/0074637 A1 | 6/2002 | McFarland |

FOREIGN PATENT DOCUMENTS

| JP | 11-307717 | 11/1999 |
| KR | 10-2004-0056437 | 7/2004 |
| KR | 10-2004-0057640 | 7/2004 |

OTHER PUBLICATIONS

Korean Office Action dated May 19, 2006.

*Primary Examiner*—Roy K Potter
(74) *Attorney, Agent, or Firm*—Harness Dickey & Pierce, P.L.C.

(57) ABSTRACT

Provided is a stack package using an anisotropic conductive film (ACF) for reducing thermal stresses exerted on chip scale packages (CSPs) during the initial manufacture of stack packages from a plurality of CSPs and for facilitating the repair and/or rework of stack packages incorporating CSPs while reducing the likelihood of damage to the CSPs. In the stack package including a plurality of CSPs stacked using an ACF, each CSP will typically include a circuit board, a semiconductor chip mounted on and electrically connected to the circuit board, and solder balls or other conductive structures arranged the semiconductor chip on the peripheral regions of the circuit board. Also provided are methods for the initial production of such stack packages and supplemental methods for the repair and rework of such stack packages.

5 Claims, 4 Drawing Sheets

STACK PACKAGE USING ANISOTROPIC CONDUCTIVE FILM (ACF) AND METHOD OF MAKING SAME

PRIORITY STATEMENT

This is a Divisional Application of application Ser. No. 11/133,317, filed May 20, 2005, now U.S. Pat. No. 7,291,925 which is an U.S. nonprovisional patent application claiming priority under 35 U.S.C. § 119 to Korean Patent Application No. 2004-93479, filed on Nov. 16, 2004, in the Korean Intellectual Property Office, the contents of both of which are hereby incorporated by reference in their entirety.

BACKGROUND OF THE INVENTION

1. Field of the Invention

The present invention relates to a semiconductor package and, more particularly, to a three-dimensional package that combines a plurality of chip scale packages (CSPs) stacked using an anisotropic conductive film interposed between CSPs and a method of manufacturing such packages.

2. Description of the Related Art

As the electronic industry pushes for smaller, lighter, faster, more versatile, higher-performance, more reliable, and cheaper products, package assembly technology becomes more important to achieve these design goals. A ball grid array (BGA) package is one solution that tends to offer reduced assembly area on a mother board and improved electrical characteristics when compared with other common plastic packages.

In contrast to conventional plastic packages, BGA packages typically use a printed circuit board (PCB) instead of a lead frame. The BGA package has an array of solder balls formed on the bottom surface of the printed circuit board and can provide high density mounting on a mother board. BGAs, however, limit the degree to which the size of the PCB can be decreased. Because the semiconductor chip is attached to a portion of PCB on which circuit wires are not formed, the PCB is necessarily larger than the semiconductor chip. Chip scale packages (CSPs) have been introduced to address this limitation.

Various types of CSPs have been introduced by companies in the U.S., Japan, and Korea and others are being developed. A representative example of a CSP is a BGA package utilizing a tape circuit board in which a circuit pattern is formed on a flexible polyimide tape. Beam lead bonding or wire bonding are generally used to establish electrical connections between the tape circuit board and the semiconductor chip.

Another technology used for reducing package size is the three-dimensional stacking of a plurality of semiconductor chips and/or packages. A package incorporating this three-dimensional packaging is usually called a stack package.

A stack package that includes a plurality of normal semiconductor packages in one package tends to reduce the failure rate because the stack package is constructed only from semiconductor packages that have already passed a reliability and/or functionality test. However, the thickness of the stack package increases in direct proportion to the number of semiconductor packages stacked. A stack package with a plurality of semiconductor chips (also called a 'stacked chip package') can provide a reduced package thickness, but also tends to increase the risk of high failure rate since the functionality of each of the included semiconductor chips is not verified prior to its inclusion in the package. In light of these problems, stack packages including a plurality of CSPs are preferred as they typically provide a combination of the lower failure rate associated with stack packages of normal semiconductor packages and the reduced thickness of the stacked chip package.

FIG. 1 shows a conventional stack package 200 including two CSPs 110a and 110b. As illustrated in FIG. 1, the CSP 110a, the lower CSP, and the CSP 110b, the upper CSP, are arranged in a stacked configuration. When the conventional stack package 200 has three or more CSPs, additional intermediate CSPs (not shown) are interposed between the uppermost CSP and lowermost CSP.

As illustrated in FIG. 1, the lower and upper CSPs 110a, 110b each includes a semiconductor chip 120 and a circuit board 130. The semiconductor chip 120 is mounted on a top surface of the circuit board 130, and solder balls 170 are provided on peripheral regions, i.e., outside the edges of the semiconductor chip, of a bottom surface of the circuit board 130. In order to allow three-dimensional stacking of the CSPs 110a and 110b, the height of solder balls 170 will typically be greater than the height of the semiconductor chip 120 to maintain separation of the semiconductor chip and the circuit board.

The conventional stack package 200 is manufactured by directly attaching the solder balls 170 of the upper CSP 110b to the top surface of the circuit board 130 of the lower CSP 110a. To accomplish this, a solder reflow process (hereinafter referred to as a "reflow process") is performed after the upper CSP 110b is mounted so that the solder balls 170 are aligned with corresponding structures provided on the top surface of the circuit board 130 of the lower CSP 110a.

During the reflow process(es) applied to the conventional package during the three-dimensional stacking of a plurality of CSPs, thermal stress exerted on the CSPs may result in mechanical failures such as warpage of the package. Because conventional CSPs are relatively thin, they tend to be more susceptible to thermal stress than larger packages. Further, the multiple reflow processes carried out when forming solder balls on a CSP and when forming a stack package increases the possibility of warpage of the included CSPs. The warpage of the CSPs may, in turn, degrade solder attachment reliability between adjacent CSPs due to variation in height of solder balls.

In particular, an unacceptable degree of misalignment of the solder balls detected during the manufacture of a stack package may prompt a repair or rework process that will include at least one additional reflow process. The thermal stresses exerted during these "repair" reflow process(es) will tend to increase the possibility of warping one or more of the CSPs.

Furthermore, when CSPs having misaligned solder balls are separated during a repair process, the solder balls attaching the adjacent CSPs being separated may separate incompletely, particularly where the solder balls of an upper CSP have been solidly attached to a circuit board of a lower CSP using a reflow process. Because a CSP with one or more defective solder balls will usually be rejected, this rework or repair process will also tend to reduce the manufacturing yields. In addition, using a CSP that has suffered minor, but undetected, damage may avoid being rejected and may degrade the reliability of a manufactured stack package incorporating the damaged CSP.

SUMMARY OF THE INVENTION

Exemplary embodiments of the present invention include a stack package designed to reduce thermal stress exerted on a chip scale package (CSP) during the process of stacking of CSPs. Exemplary embodiments of the present invention also provide improved stack packages designed to facilitate repair or rework processes while reducing the likelihood of damage to a CSP during such operations.

An exemplary embodiment of the invention provides a stack package including a plurality of CSPs stacked using an anisotropic conductive film (ACF) to form a portion of the inter-CSP mechanical and electrical connection. Each CSP will typically include a circuit board, a semiconductor chip mounted on a top surface of, and electrically connected to, the circuit board, and solder balls arranged on a peripheral region, outside the semiconductor chip, of a bottom surface of the circuit board. The exemplary stack package may include a thermoplastic ACF that is applied to a peripheral region, outside the semiconductor chip, of the top surface of a circuit board of a lower CSP. The thermoplastic ACF is used for attaching and electrically connecting the solder balls on an upper CSP to corresponding structures provided on the circuit board of the lower CSP.

In exemplary stack packages manufactured in accordance with the invention, the height of the solder balls on the upper CSP, when added to the height of the ACF, will typically be at least slightly greater than the height of the semiconductor chip mounted on the top surface of the circuit board of the lower CSP.

In exemplary stack packages manufactured according to the invention, each lower or intermediate CSP will include contact pads formed on the top surface of the circuit board corresponding to the array of solder balls provided on the bottom surface of the adjacent upper or intermediate CSP. The solder balls from the upper of two adjacent CSPs will be aligned with corresponding contact pads and mechanically and electrically connected through the ACF. The ACF may be attached to the contact pads prior to assembly of the stack package.

ACFs configured according to exemplary embodiments of the invention will typically contain fine conductive particles distributed in an insulating thermoplastic adhesive film. The distribution of the conductive particles in the ACF will be such that in an uncompressed state the ACF is more resistive and in a compressed state, i.e., when pressed between a leading surface of a solder ball and a contact pad, will become more conductive.

Packages configured according to exemplary embodiments of the invention may be manufactured and reworked or repaired in accord with exemplary manufacturing methods utilizing the thermoplastic properties of the ACF. An exemplary manufacturing method may include the steps of preparing a first CSP having a plurality of conductive structures such as solder balls extending from a lower surface; preparing a second chip scale package (CSP) having a plurality of conductive regions, such as ball pads, provided on an upper surface; forming a anisotropic conductive film (ACF) on at least the plurality of conductive regions; aligning the conductive structures with corresponding conductive regions; and reducing the spacing between the CSPs while maintaining the aligned orientation whereby regions of the ACF are compressed and form electrical connections between the conductive structures and the corresponding conductive regions.

BRIEF DESCRIPTION OF THE DRAWINGS

The features described above and other features and advantages of the invention will be described in greater detail below with respect to exemplary embodiments and through reference to the attached drawings in which.

Figure 1:
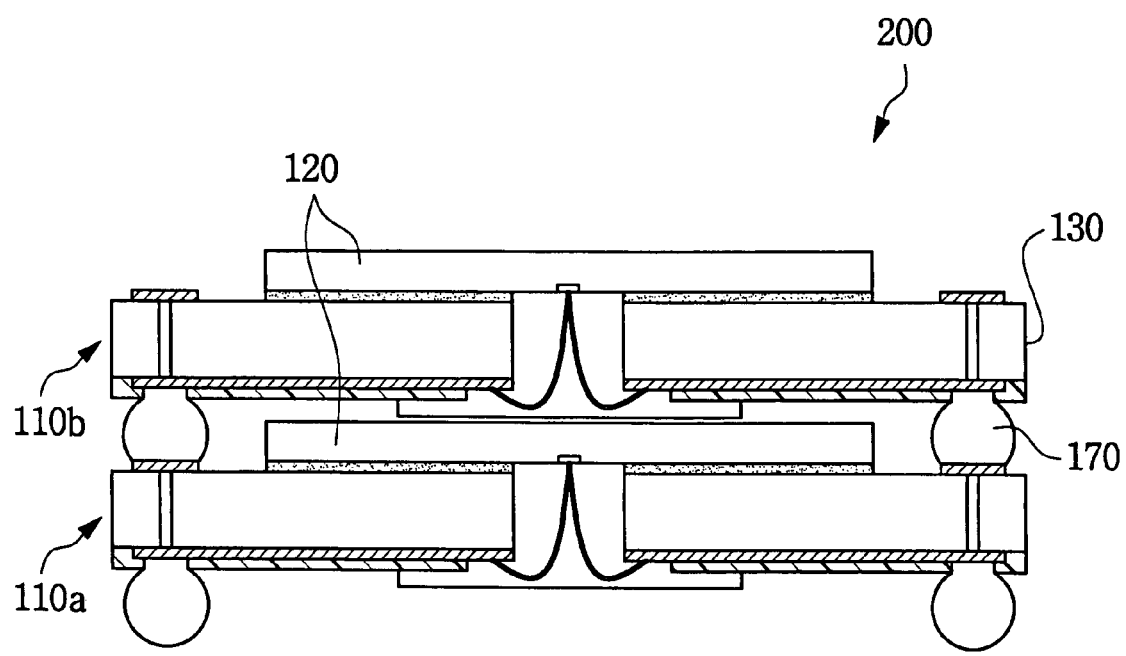
FIG. 1 is a cross-sectional view of a conventional stack package.

These drawings have been provided to assist in the understanding of the exemplary embodiments of the invention as described in more detail below and should not be construed as unduly limiting the invention. In particular, the number, relative spacing, positioning, sizing and dimensions of the various elements illustrated in the drawings are not drawn to scale and may have been exaggerated, reduced or otherwise modified for the purpose of improved clarity.

Those of ordinary skill in the art will also appreciate that a range of alternative configurations have been omitted simply to improve the clarity and reduce the number of drawings. Those of ordinary skill will appreciate that certain of the various structural elements illustrated or described with respect to the exemplary embodiments may be selectively and independently combined to create other stack package configurations and assembly methods useful for manufacturing semiconductor devices without departing from the scope and spirit of this disclosure.

DETAILED DESCRIPTION OF EXEMPLARY EMBODIMENTS

The invention will now be described more fully with reference to the accompanying drawings, in which exemplary embodiments of the invention are illustrated. Throughout the discussion the terms upper, lower, top, bottom, vertical and horizontal are used for convenience in designating the relative positions of various structural elements or portions or regions on the structural elements. The use of these terms should not, therefore, be understood as requiring that the stack packages be maintained in any particular orientation.

Figure 2:
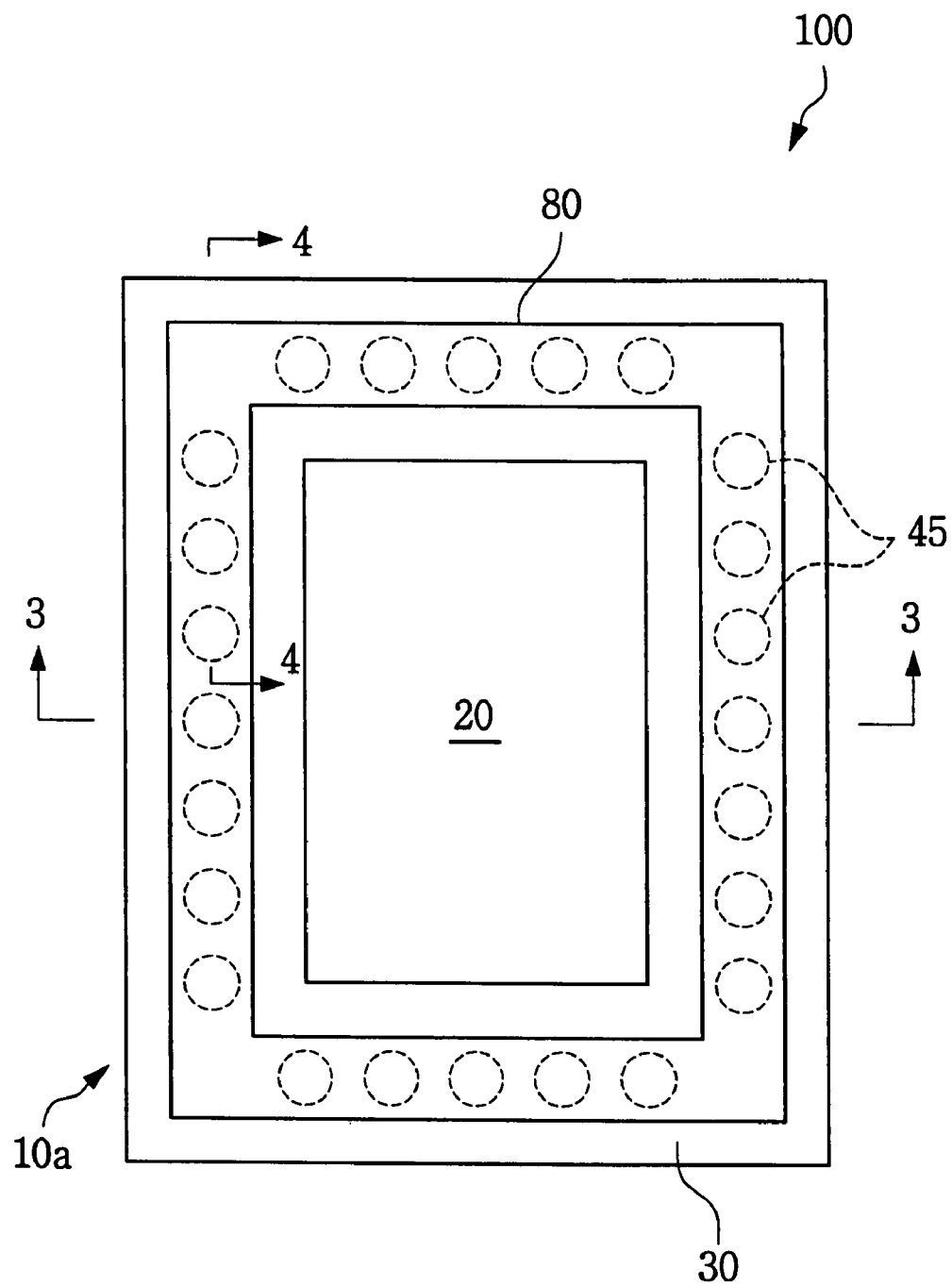
FIG. 2 is a plan view of a stack package using an anisotropic conductive film (ACF) according to an exemplary embodiment of the invention, in which the ACF has been applied to a lower chip scale package (CSP)
Figure 3:
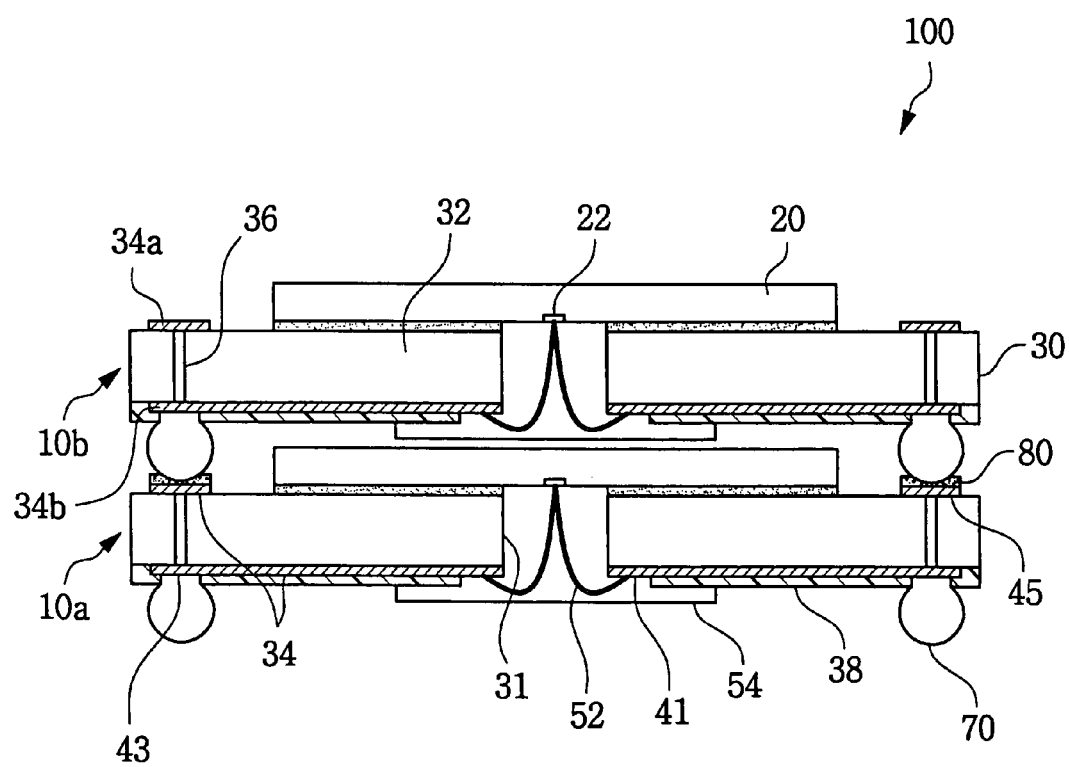
FIG. 3 is a cross-sectional view taken along line 3-3 of FIG. 2, showing an exemplary configuration in which an upper CSP has been stacked on the lower CSP.
Figure 4:
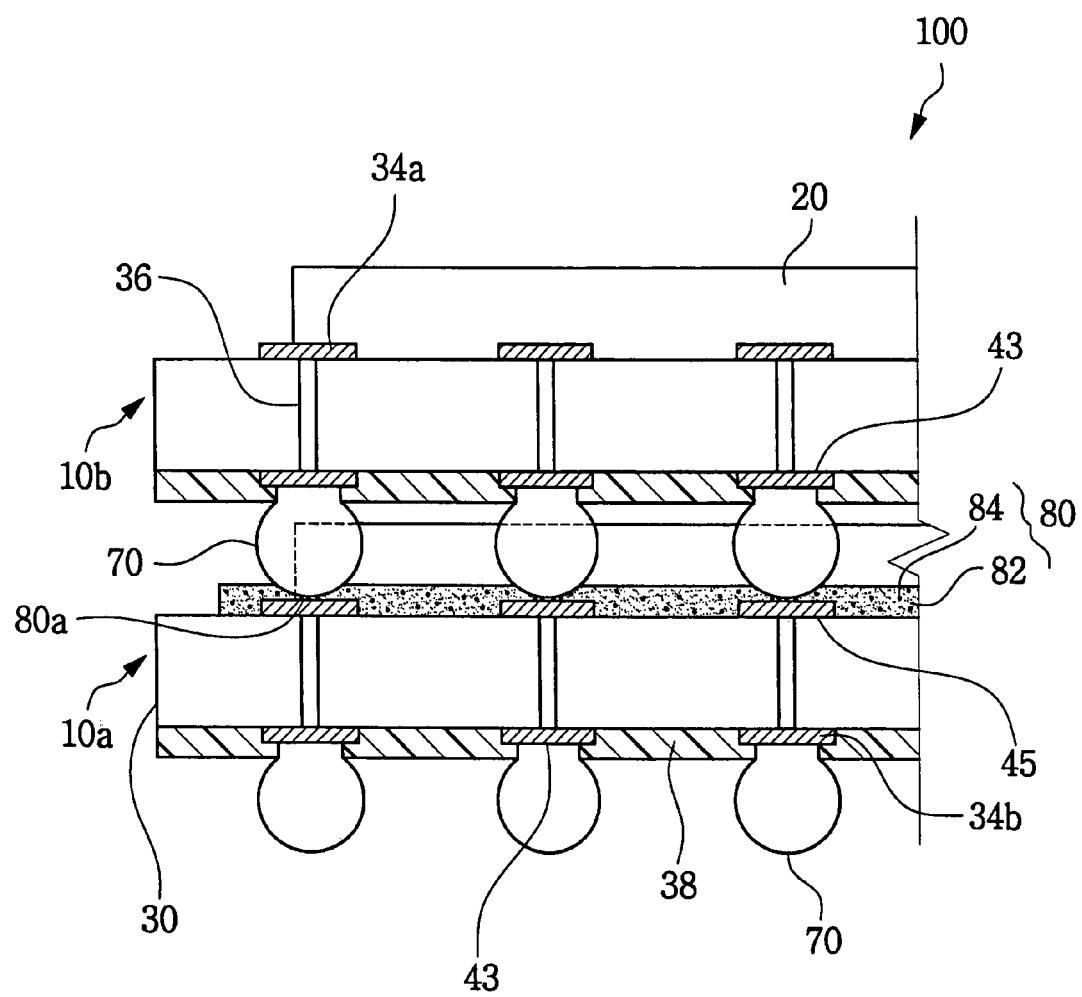
FIG. 4 is a cross-sectional view taken along line 4-4 of FIG. 2, showing an exemplary configuration in which an upper CSP has been stacked on the lower CSP.

FIG. 2 is a plan view of a stack package 100 incorporating an anisotropic conductive film (ACF) 80 according to an exemplary embodiment of the invention, in which the ACF 80 has been attached to a lower chip scale package (CSP) 10a. FIG. 3 is a cross-sectional view taken along line 3-3 of FIG. 2, illustrating an exemplary configuration in which an upper CSP 10b has been stacked on the lower CSP 10a. FIG. 4 is another cross-sectional view taken along line 4-4 of FIG. 2, illustrating an exemplary configuration in which the upper CSP 10b has been stacked on the lower CSP 10a. In order to better visualize the ACF 80 as applied to the lower CSP 10a, the upper CSP 10b is not shown in FIG. 2.

As illustrated in FIGS. 2-4, an exemplary stack package 100 has a structure in which the lower CSP 10a and upper CSP 10b are three-dimensionally or vertically stacked, with both CSPs having solder balls 70 arranged on peripheral regions of their bottom surfaces. The ACF 80 is interposed between the top surface of the lower CSP 10a and the solder balls 70 of the upper CSP 10b so that the two CSPs 10a and 10b are vertically stacked and electrically connected to each other. The exemplary stack package 100 allows electrical connection between the lower and upper CSPs 10a and 10b by heating and pressing the solder balls 70 of the upper CSP 10b against the ACF 80 formed or provided on at least the contact pads provided on the top surface of the circuit board 30 of the lower CSP 10a.

As illustrated in FIG. 3, the CSPs 10a, 10b can be a pair of face-down semiconductor packages in which an active surface of the semiconductor chip 20 faces downwardly and is mounted to the top surface of the circuit board 30. The semiconductor chip is also electrically connected to a conductive pattern 34b provided on the bottom surface of the circuit board 30. Solder balls 70 are formed in the peripheral region of the bottom surface of the circuit board 30.

As illustrated in FIG. 3, the semiconductor chip 20 may be a center pad type chip having a plurality of electrode pads 22 provided on a central portion of the active surface. The center pad type semiconductor chip 20 may provide higher speed and higher power than a similar edge pad type semiconductor chip.

The circuit board 30 includes an opening or a window 31 arranged to expose the electrode pads 22 of the semiconductor chip 20, and may include a metal circuit layer 34 provided on the top and bottom surfaces of the circuit board 30. The circuit board 30 may be a tape circuit board or a printed circuit board (PCB). The circuit board 30 will typically include a central opening or window 31, a board body 32 having an area larger than the active surface of the semiconductor chip 20, and metal circuit layers 34a, 34b formed on the top and bottom surfaces of the board body 32. The metal circuit 34 consists of a lower circuit layer 34b formed on the bottom surface of the board body 32 and an upper circuit layer 34a formed on the top surface thereof.

The lower circuit layer 34b includes board pads 41 that are located near the window 31 that are electrically connected to the electrode pads 22 of the semiconductor chip 20. The lower circuit layer 34b also includes ball pads 43 that are electrically connected to the board pads 41 and are formed in a peripheral region of the bottom of the board body 32. The upper circuit layer 34a includes contact pads 45 formed on the top surface of the board body 32 that generally corresponds to placement of the ball pads 43 on an adjacent CSP.

The contact pads 45 can be electrically connected to the ball pads 43 through connectors formed through via holes 36. An insulating protective layer 38 is typically formed on the lower surface of the board body 32, other than the board pads 41, ball pads 43, and contact pads 45, to insulate and protect the other portions of the lower metal circuit layer 34b. The insulating protective layer 38 may be formed from photo solder resist (PSR) or another suitable polymeric material.

During the three-dimensional stacking of the CSPs 10a and 10b, the CSPs are typically aligned so that the ball pads 43 and the contact pads 45 disposed on the opposed top and bottom surfaces of the adjacent board bodies 32 are aligned with each other. Maintaining this aligned position, the solder balls 70 of the upper CSP 10b are brought into contact with the corresponding contact pads 45 of the lower CSP 10a. The solder balls are typically positioned and sized so that the CSPs can be attached in a stacked configuration without the semiconductor chip 20 of the lower CSP 10a interfering with the solder balls of the upper CSP 10b or prematurely contacting a portion of the upper CSP.

While the circuit board 30 has been described as having the metal circuit layer 34 on the top and bottom surfaces of the board body 32, it may further include one or more intermediate metal circuit layers positioned within the board body 32. Further, one or more of the circuit layers may be formed from conductive materials other than metal, such as a conductive polymer.

The electrode pads 22 of the semiconductor chip 20 and the board pads 41 of the circuit board 30 exposed through the window 31 are electrically connected to each other using bonding wires 52 that extend through the window 31. The electrode pads 22 exposed through the window 31, the board pads 41, and the bonding wires 52 may be protected from the exposure to external environmental contaminants, moisture and physical damage by an encapsulant material 54, such as a molding compound resin filling the window 31 and extending over the board pads.

Each solder ball 70 is placed on a corresponding ball pad 43. While in the illustrated embodiment, the solder balls 70 are shown as providing the external contact terminals on the lowermost CSP, it will be appreciated that this precise structure is not required and the solder balls may be replaced by metal bumps made of Ni or Au or other suitable conductive structures for mounting the stack package on PCBs or in dedicated sockets. In order to facilitate soldering of the stack package 100 to external devices, the solder balls 70 or other external contact structures will typically be formed to project downwardly from the bottom surface by a distance extending beyond the portion of the resin encapsulant 54 that extends from the bottom surface of the circuit board 30.

The CSPs 10a and 10b having the exemplary structure described above may then be stacked vertically and electrically connected to each other using an ACF 80 sandwiched therebetween. The ACF 80 includes an insulating adhesive film 82 made of thermoplastic resin, and fine conductive particles 84 dispersed throughout the insulating adhesive film. The ACF 80 is applied to the contact pads 45 formed in the peripheral region of the top surface of the circuit board 30 of the lower CSP 10a.

An exemplary method of stacking the upper CSP 10b on the lower CSP 10a using the ACF 80 will typically include at least the steps of attaching solder balls 70 to the ball pads 43 of the upper CSP, aligning the solder balls 70 of the upper CSP with the corresponding contact pads 45 of the lower CSP, attaching the solder balls 70 and electrically connecting the solder balls to the contact pads 45 using the ACF 80 disposed therebetween by heating the ACF and pressing or urging the upper and lower CSPs toward each other while maintaining their relative alignment. More specifically, the electrical connection between the solder balls 70 and the contact pads 45 is provided through the conductive particles 84 contained in the ACF 80 located therebetween.

The ACF 80 is configured to perform as an insulator in the horizontal direction because the conductive particles 84 are dispersed in the horizontal direction a degree that prevents sufficient numbers of the conductive particles from contacting one another and forming a horizontal conductive path. As illustrated in FIG. 4, when the ACF 80 is compressed between the corresponding solder balls 70 and contact pads 45, the insulating nature of the ACF is altered and a conductive region 80a is formed in the ACF between the solder balls and contact pads. The upper CSP 10b is stacked on the lower CSP 10a by utilizing the insulating adhesive film 82 component of the ACF 80 to maintain the mechanical attachment between the stacked CSPs.

The thermoplastic resin component of the insulating adhesive film 82 facilitates repair and rework processes that involve separating one or more of the stacked CSPs from the manufactured stack package 100. That is, when manufacturing defects such as solder ball misalignment necessitate repair or rework of a stack package, the CSPs may be more easily separated from the thermoplastic ACF 80 and thereby reduce the likelihood of damage to the solder balls. Specifically, by heating the ACF to a temperature sufficient to soften or melt the thermoplastic component without reaching a reflow temperature, the CSPs can be separated in a manner that reduces likelihood of damage to the solder balls 70, ball pads 43 or contact pads 45 during the separation step of the rework or remanufacturing process.

Further, in order to reduce the likelihood of damage to the semiconductor chip 20 in the lower CSP 10a during the stacking process, the height of the ACF 80 plus the height of the solder balls 70 in the upper CSP 10b may be adjusted to provide a final height greater than the height of the semiconductor chip 20 mounted on the circuit board 30 in the lower CSP 10a. Alternatively, a resilient buffer such as an interposer may be formed on the bottom surface of the semiconductor chip 20 in the upper CSP 10b.

While the present invention has been particularly shown and described with reference to exemplary embodiments thereof, the invention should not be construed as being limited to the particular embodiments set forth herein; rather, these embodiments are provided to convey more fully the concept of the invention to those skilled in the art. Thus, it will be apparent to those of ordinary skill in the art that various changes in form and details may be made therein without departing from the spirit and scope of the present invention as defined by the following claims.

For example, while the present invention has been described with reference to a stack package including two CSPs, the package may include three or more CSPs stacked using an ACF interposed between each of the adjacent CSPs. A CSP may also have various other structures. For example, any CSP with solder balls formed in the peripheral regions thereof to provide vertical stacking and electrical connection with another CSP can be used to implement a stack package using an ACF.

Similarly, although the invention has been illustrated and described with respect to center pad type semiconductor chips, as will be appreciated, other pad configurations may be utilized with the configuration of the opening(s) provided in the PCB modified accordingly. Further, the semiconductor chips and PCBs may be configured to provide for flip-chip type mounting of the semiconductor chip on the PCB with the electrical connections being provided through conductive via or other alternative wiring schemes that avoid the need for openings in the PCB and/or the use of bonding wires. Particularly for more challenging design rules, these techniques may simplify the mounting process and/or improve the mechanical strength of the resulting PCB.

Therefore, an exemplary stack package according to the invention will enable the attachment of solder balls from an upper CSP to a circuit board in a lower CSP by heating and pressing the CSPs together with the ACF interposed between adjacent CSPs, thereby achieving the stacking of CSPs at a lower temperature than the conventional solder reflow temperature to form a stack package while reducing the thermal stresses exerted on CSPs.

The exemplary stack packages according to the invention, by incorporating a thermoplastic resin for the insulating adhesive film of the ACF to allow rework stack packages to be more easily separated by applying heat to soften the ACF and thereby facilitate a repair process for the manufactured stack package while reducing the likelihood of damage to solder balls provided on the CSP.

What is claimed is:

1. A method of manufacturing a stack package comprising:
   preparing a first chip scale package (CSP) having a plurality of conductive structures extending from a lower surface;
   preparing a second chip scale package (CSP) having a plurality of conductive regions provided on an upper surface;
   forming a anisotropic conductive film (ACF) on the plurality of conductive regions;
   aligning the first CSP and the second CSP whereby each of the conductive structures is aligned with a corresponding conductive region; and
   reducing the spacing between the first CSP and the second CSP while maintaining an aligned orientation whereby regions of the ACF are compressed and form electrical connections between the conductive structures and the corresponding conductive regions.

2. The method of manufacturing a stack package according to claim 1, further comprising:
   heating the ACF to a temperature $T_s$ sufficient to soften a thermoplastic component of the ACF;
   cooling the ACF while compressed between the conductive structures and the corresponding conductive regions to form a mechanical connection between the first CSP and the second CSP.

3. The method of manufacturing a stack package according to claim 2, wherein:
   the conductive structures are solder balls;
   the conductive regions are ball pads; and
   the temperature $T_s$ is below a reflow temperature $T_{RF}$ at which the solder balls will flow.

4. The method of manufacturing a stack package according to claim 3, further comprising:
   reheating the stack package to a temperature of at least $T_s$ and below $T_{RF}$;
   separating the first CSP and the second CSP;
   correcting a defective element on the first CSP or the second CSP;
   realigning the first CSP and the second CSP whereby each of the conductive structures is aligned with a corresponding conductive region; and
   reducing the spacing between the first CSP and the second CSP while maintaining the realigned orientation whereby regions of the ACF are compressed and form electrical connections between the conductive structures and the corresponding conductive regions.

5. The method of manufacturing a stack package according to claim 3, further comprising:
   reheating the stack package to a temperature of at least $T_s$ and below $T_{RF}$;
   separating the original first and second CSPs;
   discarding one of the original CSPs and providing a replacement CSP;
   aligning a remaining original CSP and the replacement CSP whereby each of the conductive structures is aligned with a corresponding conductive region; and
   reducing the spacing between the remaining original CSP and the replacement CSP while maintaining the realigned orientation whereby regions of the ACF are compressed and form electrical connections between the conductive structures and the corresponding conductive regions.

* * * * *